(12) United States Patent
Wu

(10) Patent No.: US 8,990,055 B2
(45) Date of Patent: Mar. 24, 2015

(54) METHOD AND APPARATUS FOR SIMULATION OF A SYSTEM IN A COMMUNICATIONS NETWORK

(75) Inventor: Wenbiao Wu, Vallentuna (SE)

(73) Assignee: Telefonaktiebolaget L M Ericsson (publ), Stockholm (SE)

(\*) Notice: Subject to any disclaimer, the term of this patent is extended or adjusted under 35 U.S.C. 154(b) by 429 days.

(21) Appl. No.: 13/497,942

(22) PCT Filed: Dec. 18, 2009

(86) PCT No.: PCT/SE2009/051451
§ 371 (c)(1),
(2), (4) Date: Mar. 23, 2012

(87) PCT Pub. No.: WO2011/037508
PCT Pub. Date: Mar. 31, 2011

(65) Prior Publication Data
US 2012/0197609 A1    Aug. 2, 2012

Related U.S. Application Data

(60) Provisional application No. 61/245,374, filed on Sep. 24, 2009, provisional application No. 61/248,640, filed on Oct. 5, 2009.

(51) Int. Cl.
*G06F 7/60* (2006.01)
*G06F 17/10* (2006.01)
(Continued)

(52) U.S. Cl.
CPC .......... *H04L 41/145* (2013.01); *G06F 11/3447* (2013.01); *G06Q 10/06* (2013.01);
(Continued)

(58) Field of Classification Search
CPC  H04L 41/5003; H04L 41/5035; G06Q 10/04; G06Q 10/06; G06F 17/5009; G06F 17/509
USPC .......................................................... 703/2
See application file for complete search history.

(56) References Cited

U.S. PATENT DOCUMENTS 5,561,841 A * 10/1996 Markus ..................... 455/446
5,727,051 A *  3/1998 Holender ................ 379/112.05
(Continued)

OTHER PUBLICATIONS

Jensen, Terje, "Network Planning-Introductory Issues", Telekrtonikk, vol. 99, No. 3/4, 2003, pp. 9-46.*
(Continued)

*Primary Examiner* — Mary C Jacob
(74) *Attorney, Agent, or Firm* — Murphy Bilak & Homiller, PLLC

(57) ABSTRACT

The invention relates to a method and apparatus for simulating a system in a communications network as a linear system in order to obtain a prediction of the load of a resource in the system. Measurements obtained at m different points in time of the event intensity $a_{event}$ for a number n of key events occurring in a reference system are used to form the simulation model, together with measurements of the total load L in the reference system at the m different points in time. An optimization problem, defined by the simulation model and a set of event intensities of the system-to-be-predicted in a scenario to be simulated, is solved in order to obtain a prediction of the total load of the system in the simulated scenario.

13 Claims, 10 Drawing Sheets

(51) Int. Cl.
*H04L 12/24* (2006.01)
*G06F 17/50* (2006.01)
*G06Q 10/04* (2012.01)
*H04W 16/22* (2009.01)
*G06F 11/34* (2006.01)
*G06Q 10/06* (2012.01)
*H04W 24/08* (2009.01)

(52) U.S. Cl.
CPC ......... *G06F 17/509* (2013.01); *G06F 17/5009* (2013.01); *G06Q 10/04* (2013.01); *H04L 41/147* (2013.01); *H04W 16/22* (2013.01); *H04W 24/08* (2013.01)
USPC .................. 703/2; 703/13; 703/21; 709/223; 709/226

(56) References Cited

U.S. PATENT DOCUMENTS

| | | | |
|---|---|---|---|
| 6,246,880 B1 * | 6/2001 | Iizuka | 455/446 |
| 6,557,035 B1 | 4/2003 | McKnight | |
| 6,735,553 B1 | 5/2004 | Frogner et al. | |
| 6,973,622 B1 * | 12/2005 | Rappaport et al. | 715/735 |
| 7,065,573 B2 * | 6/2006 | Byrnes | 709/224 |
| 7,082,381 B1 | 7/2006 | Saghier et al. | |
| 7,353,294 B1 | 4/2008 | Nucci et al. | |
| 2003/0023719 A1 | 1/2003 | Castelli et al. | |
| 2003/0061017 A1 * | 3/2003 | Dotaro et al. | 703/14 |
| 2005/0089063 A1 | 4/2005 | Haruna et al. | |

OTHER PUBLICATIONS

Bonaventure et al, "Internet Traffic Engineering", Lecture Notes in Computer Science, vol. 2856, pp. 118-179, 2003.*

Eisenblatter et al, "Wireless Network Design: Solution-Oriented Modeling and Mathematical Optimization", IEEE Wireless Communications, Dec. 2006.*

Eisenblatter et al, "Planning UTMS Radio Networks", OR/MS Today, Dec. 2008.*

Murray, K. et al. "Neural Network based Adaptive Radio Resource Management for GSM and IS136 Evolution." IEEE VTS 54th Vehicular Technology Conference, Atlantic City, NJ, US, Oct. 7-11, 2001.

* cited by examiner

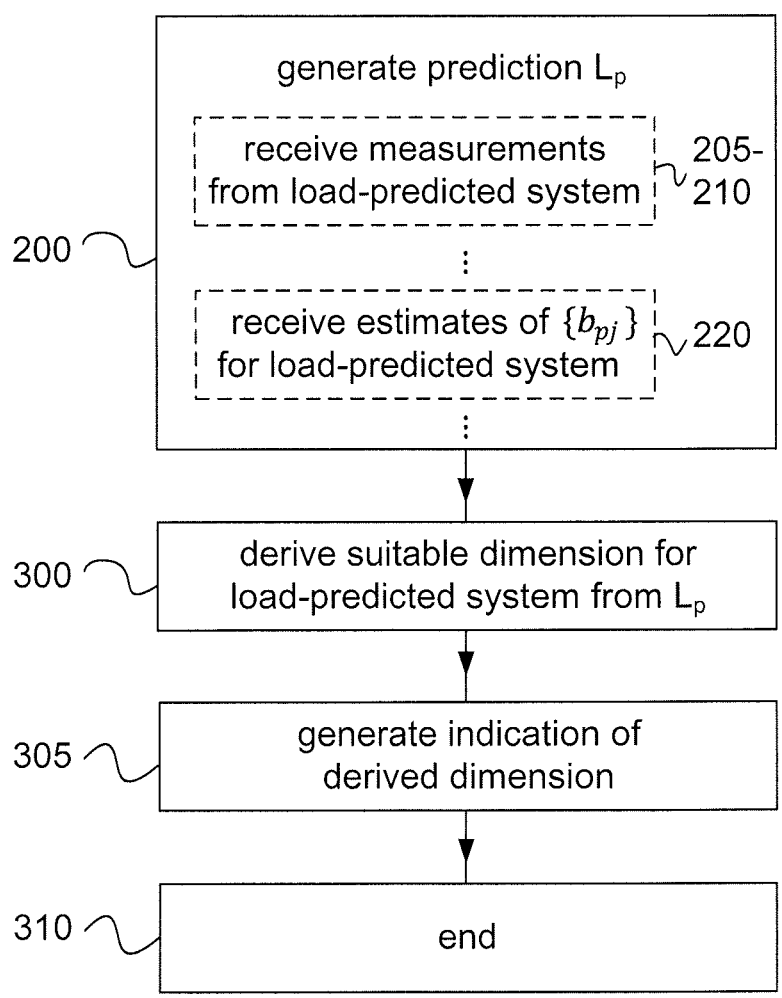

Fig. 8

| t | $a_{ij}$ [Events/s] | | | | | | | | $a_{ij}$ [kbps] | | | | $L_i$ (%) |
|---|---|---|---|---|---|---|---|---|---|---|---|---|---|
| | Speech Access | CS Data Access | PS R99 Access | HS Access | Loc Update & SMS | Cell Update | URA Update | Channel Switching | Soft/Softer HO Type 1 | Soft/Softer HO Type 2 | Voice | CS | PS | HS | |
| 080401:0000-0015 | 0,0296 | 0,000038 | 0,0633 | 0,0095 | 0,2999 | 0,09887 | 0 | 0,1114 | 0,5836 | 0,1146 | 26,389 | 0,188484 | 8,8999 | 11,7672 | 6,05 |
| 080401:0030-0045 | 0,0431 | 0,000085 | 0,0726 | 0,0108 | 0,3968 | 0,11825 | 0 | 0,1345 | 0,8572 | 0,174 | 42,712 | 0,141495 | 11,455 | 20,6116 | 8,19 |
| 080401:0100-0115 | 0,0596 | 0,000066 | 0,0979 | 0,013 | 0,3965 | 0,15321 | 0 | 0,1699 | 1,0745 | 0,2281 | 61,149 | 0,147102 | 15,064 | 24,4729 | 10,15 |
| 080401:0145-0200 | 0,0761 | 0,000085 | 0,1095 | 0,0174 | 0,3574 | 0,17934 | 0 | 0,2023 | 1,2513 | 0,2862 | 82,118 | 0,084398 | 11,894 | 28,3148 | 12,01 |
| 080401:0245-0300 | 0,0965 | 0,000104 | 0,11 | 0,0196 | 0,3892 | 0,19546 | 0 | 0,2279 | 1,5135 | 0,3404 | 105,87 | 0,340827 | 12,392 | 29,6001 | 14,36 |
| 080401:0415-0430 | 0,1311 | 0,000142 | 0,1009 | 0,0233 | 0,4192 | 0,1925 | 0 | 0,2262 | 1,8088 | 0,3963 | 141,55 | 0,454382 | 16,177 | 43,3288 | 17,73 |
| 080401:0500-0515 | 0,1433 | 0,000218 | 0,0833 | 0,0205 | 0,4511 | 0,16112 | 0 | 0,1865 | 2,0088 | 0,4295 | 165,22 | 1,16248 | 13,978 | 46,2987 | 19,32 |
| 080401:0545-0600 | 0,1275 | 0,000275 | 0,086 | 0,0235 | 0,4162 | 0,16103 | 0 | 0,1808 | 1,938 | 0,425 | 157,56 | 1,14465 | 14,306 | 44,9473 | 18,71 |
| 080401:0830-0845 | 0,147 | 0,000247 | 0,1071 | 0,0219 | 0,4581 | 0,19215 | 0 | 0,2174 | 2,1598 | 0,4909 | 168,63 | 1,26992 | 13,618 | 47,0604 | 20,19 |
| 080401:1015-1030 | 0,1808 | 0,000247 | 0,1032 | 0,0212 | 0,4941 | 0,18801 | 0 | 0,2078 | 2,6078 | 0,5561 | 212,47 | 2,11113 | 14,492 | 75,3847 | 24,71 |
| 080401:1100-1115 | 0,1634 | 0,000275 | 0,089 | 0,0192 | 0,4538 | 0,16836 | 0 | 0,1907 | 2,4159 | 0,518 | 202,43 | 1,32115 | 13,747 | 76,1531 | 23,57 |
| 080401:1145-1200 | 0,122 | 0,000304 | 0,0757 | 0,0174 | 0,3496 | 0,14759 | 0 | 0,1716 | 1,9297 | 0,431 | 152,21 | 1,88409 | 11,823 | 58,052 | 18,54 |
| 080401:1215-1230 | 0,1038 | 0,000228 | 0,0629 | 0,0148 | 0,3362 | 0,12507 | 0 | 0,1455 | 1,6506 | 0,3565 | 137,98 | 1,97793 | 10,52 | 50,324 | 16,72 |
| 080401:1400-1415 | 0,0752 | 0,000190 | 0,0503 | 0,0134 | 0,2607 | 0,09962 | 0 | 0,1159 | 1,493 | 0,3333 | 127,71 | 1,77063 | 8,8449 | 49,9518 | 15,68 |
| 080401:1930-1945 | 0,0053 | 0,000019 | 0,0246 | 0,0064 | 0,0741 | 0,04864 | 0 | 0,0632 | 0,1245 | 0,0188 | 7,0014 | 7,28E-05 | 3,01 | 3,33303 | 3,00 |

METHOD AND APPARATUS FOR SIMULATION OF A SYSTEM IN A COMMUNICATIONS NETWORK

TECHNICAL FIELD

The present invention relates to the field of communications networks, and in particular to the dimensioning of nodes in communications networks.

BACKGROUND

A communications network is a highly complex structure of a large number of interconnected nodes of different types, wherein vast amounts of signaling and user data can be routed on a multitude of different transmission paths. In order to ensure that the capacity of the communications network can live up to the transmission expectations of its users, while keeping equipment costs at a reasonable level, methods of estimating the number of nodes required in order to support a specified traffic behavior, or a specified traffic load in an area, are desired. Such estimates can be useful when dimensioning a new communications system, as well as in a process of adjusting the capacity of an existing communications network to changing demands.

Existing methods for dimensioning of communications networks typically use numerical models to numerically calculate the desired network characteristics and thereby assist the network planning engineer during the design process. Examples of such methods are given in Chapter 8 of "*WCDMA for UMTS*", edited by H. Holma and A. Toskala, John Wiley & Sons, Ltd, 2004, as well as in "*Radio Network Dimensioning and Planning for WiMAX Networks*", Upaso et al., Fujitsu Sci. Tech. J, Vol. 42, 4, p. 435-450.

Such numerical dimensioning models are typically very complex, and often depend on assumptions made of the physical properties of the system to be dimensioned, of the behaviour of the users of the network, and, in particular in case of radio based communications networks, of the geographical surroundings of the network. Since the quality of the numerical model determines the consistency and applicability of the obtained results to the dimensioning of real world networks, such a numerical model needs to be as precise as possible. However, due to the complexity of these systems, it's very difficult to obtain the desired precision. No matter how precise the planning and optimization approach is, if an imprecise modeling is used, the results will be useless.

SUMMARY

A problem to which the present invention relates is how to obtain a more efficient method of predicting a load in a communications network.

This problem is addressed by a method of simulating a system in a communications network in order to obtain a prediction of the load of a resource in the system. The resources for which the load is to be predicted could for example be processing resources, or data storage resources. The method comprises: receiving, at an input of a load prediction apparatus, intensity values $\{a_{ij}, i=1 \ldots m, j=1 \ldots n\}$ for n events occurring in a reference system at in different occasions $t_i$, $\{i=1 \ldots m\}$, wherein the occurrence of an event j requires a resource amount $x_j$; receiving (210), at an input of the load prediction apparatus, values of the total load $L_i$ in the reference system at the m different occasions $t_i$; and receiving, at an input of the load prediction apparatus, intensity values $\{b_{pj}\}$ for each of the n events in a scenario in the system for which the load is to be predicted. The method further comprises optimizing, in the load prediction apparatus, an object function S described by:

$$S = \Sigma_{j=1}^{n}(b_{pj}x_j),$$

subject to the linear inequality constraints described by expression (3) below, wherein $y_i$ and $z_i$ are functions of the measured total load $L_i$ of the reference system, the optimization resulting in at least one optimized outcome of the object function S, whereby a prediction $L_p$ of the total load in the system may be obtained.

The problem is further addressed by a simulation apparatus for simulating a system in a communications network in order to obtain a prediction of the load of a resource in the system. The simulation apparatus comprises: an input arranged to receive intensity values $\{a_{ij}, i=1 \ldots m, j=1 \ldots n\}$ for n events occurring in a reference system at in different occasions $t_i$, wherein the occurrence of an event j requires a resource amount $x_j$; an input arranged to receive values of the total load $L_i$ in the reference system at the m different occasions $t_i$; and an input arranged to receive intensity values $\{b_{pj}\}$ for each of the n events in a scenario in the system for which the load is to be predicted. The simulation apparatus further comprises an optimization mechanism connected to said inputs. The optimization apparatus is arranged to determine a higher boundary $z_i$ and a lower boundary $y_i$ from a received value of the total load $L_i$ in the reference system; optimize an object function S described by:

$$S = \Sigma_{j=1}^{n}(b_{pj}x_j),$$

subject to the linear inequality constraints described by expression (3) below in a manner so that the optimization results in at least one optimized outcome of the object function S, whereby a prediction $L_p$ of the total load in the system may be obtained, and to deliver a signal indicative of at least one optimized outcome of the object function S.

The problem is yet further addressed by a computer program for simulating a system in a communications network in order to obtain a prediction of the load of a resource in the system, and a by computer program product comprising computer readable means storing the computer program.

By the simulation method, apparatus, and computer program is achieved that a more accurate prediction of the load of a system in a communications network in a given scenario can be obtained by simpler means. The simulation model does not require any assumptions or estimations of the physical properties of the equipment, nor of the geographical surroundings of the system for which the load is to be predicted. Furthermore, predictions can easily and speedily be obtained for different user behaviour scenarios, since the user behavior does not form part of the system model, but rather is used as an input to form the optimization model.

The optimization of the object function can efficiently be performed by means of linear programming.

In one embodiment, the boundaries for the inequality constraints are derived from the respective values of the measured total load $L_i$ of the reference system. For example, the upper boundary may be given by $y_i = L_i(1-\rho)$ and the upper boundary may be given by $z_i = L_i(1+\delta)$. These have proven to be efficient definitions of the upper and lower boundaries for the inequality constraints whereby accurate predictions of the total load may be obtained.

In one embodiment of the invention, the object function S is optimized so as to arrive at a minimum outcome $S_{min}$ and a maximum outcome $S_{max}$ of the object function S; and the load prediction $L_p$ is obtained as a function of the minimum outcome $S_{min}$ and the maximum outcome $S_{max}$ of the object function S. The load prediction may for example be obtained as the average of the minimum outcome and maximum outcome. This embodiment had proven to give load predictions of high accuracy.

In one application, the present technology can be used for monitoring the load of a system in a communications network. In this application, the reference system and the system for which a load prediction is to be determined are the same, the received intensity values $\{b_{pj}\}$ representing a scenario for which the load is to be predicted have been obtained from measurements of the intensity of the n events in the system at a particular point in time $t_c$. In this application, the method further comprises: generating a prediction $L_p$ of the total load using at least one optimized outcome of the object function S; receiving a measurement $L_m$, obtained at the particular point in time $t_c$, of the total load to be predicted;

comparing the predicted total load $L_p$ at the time $t_c$ to the measured total load $L_m$ at the time $t_c$; and, if the measured total load $L_m$ deviates from the predicted total load $L_p$ by more than a predefined measure, then generating an indication that the measured total load $L_m$ deviates from the predicted total load $L_p$.

In this application, a load monitoring apparatus may be provided, the load monitoring apparatus comprising a simulation apparatus as described above, further comprising a prediction generation mechanism arranged to receive an output from the optimization mechanism of the simulation apparatus. The prediction generation mechanism is arranged to generate a prediction $L_p$ of the total load using at least one optimized outcome of the object function S, and to deliver a signal indicative of said prediction at on output (420) of the simulation apparatus. The load monitoring apparatus further comprises an input arranged to receive a measurement $L_m$ of the total load to be predicted; and a performance checking mechanism connected to said input and further arranged to receive, from the simulation apparatus, an output signal indicative of a predicted total load. The performance checking apparatus is further arranged to compare a predicted total load $L_p$ to a measured total load $L_m$; and to generate an indication if a measured total load $L_m$ deviates by more than a predefined measure from a predicted total load $L_p$ to which it is compared.

This application facilitates for the issuance of an early warning if the performance of the system degenerates due to resource problems.

In another application, the present technology can be used in dimensioning of a system in a communications network. In this application, at least one optimized outcome of the object function S is used to generate a prediction $L_p$ of the total load of the system-to-be-predicted. The method further comprises: generating a prediction $L_p$ of the total load using at least one optimized outcome of the object function S; deriving, from the prediction $L_p$ of the total load in the system, a value of a suitable dimension of the simulated system; and generating a signal indicative of said value of a suitable dimension.

In this application, a dimensioning apparatus for dimensioning of a system in a communications network is provide. The dimensioning apparatus comprises: a simulation apparatus as described above, comprising a prediction generation mechanism arranged to receive an output from the optimization mechanism, the prediction generation mechanism being arranged to generate a prediction $L_p$ of the total load using at least one optimized outcome of the object function S, and to deliver a signal indicative of said prediction at on output of the simulation apparatus. The dimensioning apparatus further comprises a dimension derivation mechanism arranged to receive an output signal indicative of said prediction from the simulation apparatus and arranged to derive, from a prediction $L_p$ of the total load in the system, a value of a suitable dimension of the simulated system, and to generate a signal indicative of said value of a suitable dimension.

This application allows for efficient dimensioning of new and existing systems.

Further aspects of the invention are set out in the following detailed description and in the accompanying claims.

BRIEF DESCRIPTION OF THE DRAWINGS

FIG. 3b is a flowchart illustrating another embodiment of a dimensioning method wherein the load prediction method of FIG. 2 is used.

FIG. 6b is a schematic illustration of a communications node comprising the load monitoring apparatus of FIG. 6a.

FIG. 8 is a table showing measurements of key event intensities and the total processing load at different points in time for a special purpose processing board of an RNC.

Abbreviations

BSC Base Station Controller
BTS Base Transceiver Station
CPU Central Processing Unit
CS Circuit Switch
FIFO First In First Out
GGSN Gateway GPRS Support Node
GSM Global System for Mobile communication
HLR Home Location Register
HS High Speed
KBPS Kilobits per second
LTE Long-Term Evolution
MGW Media Gateway
MP Main Processor
MSC Mobile services Switching Centre
O&M Operations and Maintenance
PS Packet Switch
RNC Radio Network Controller
SGSN Serving GPRS Support Node
WCDMA Wideband Code Division Multiple Access
UP User Plane
PM Performance Measurement
RANAP Radio Access Network Application Part

DETAILED DESCRIPTION

Figure 1:
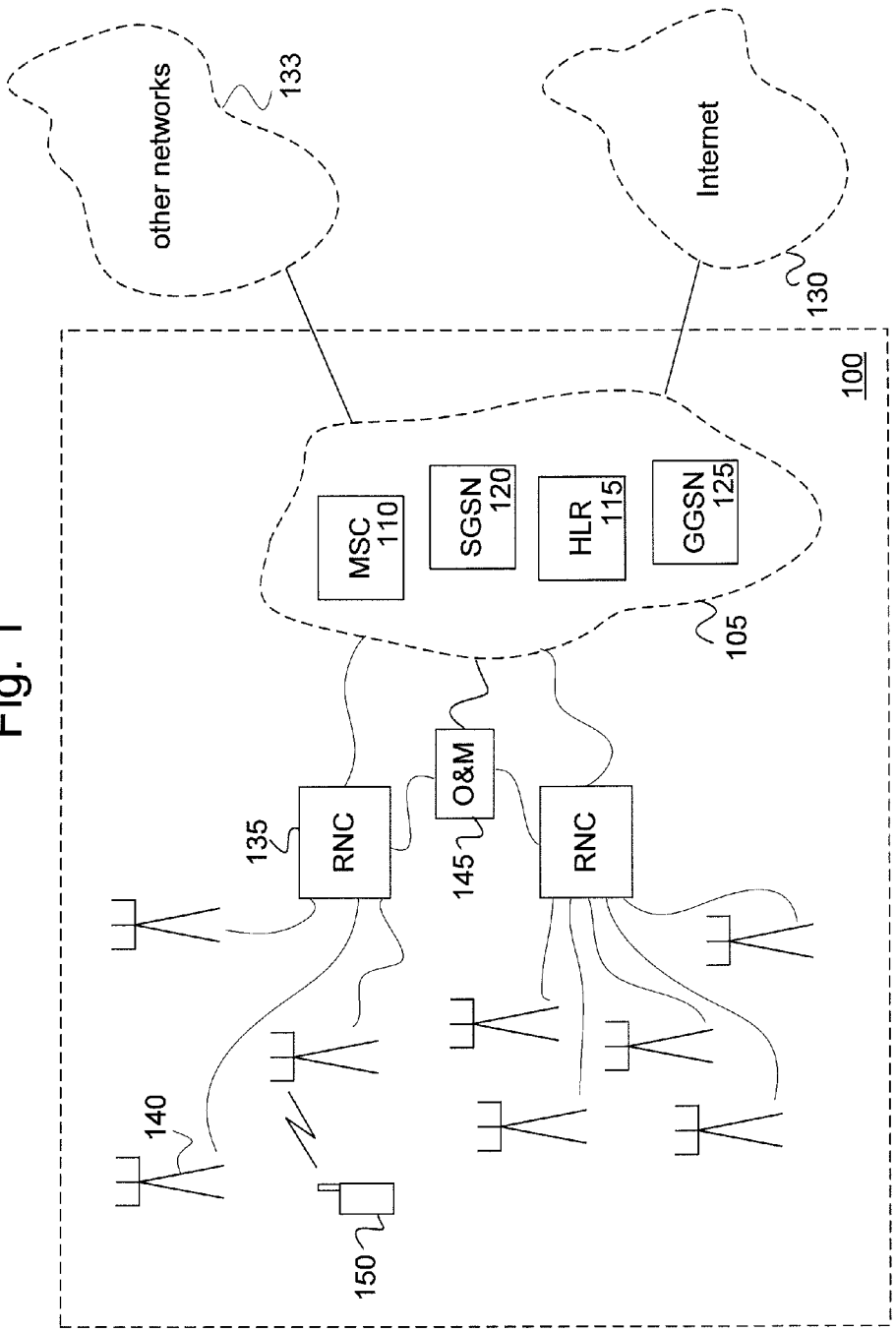
FIG. 1 is a schematic illustration of a communications system operating according to the WCDMA standard.

FIG. 1 schematically illustrates a communications network 100, or network 100 for short, in the form of a mobile radio network operating according to the WCDMA standard. Network 100 of FIG. 1 comprises a core network 105 including an MSC 110, an HLR 115, an SGSN 120 and a GGSN 125. Core network 105 is connected to the Internet 130, as well as to other networks 133, which comprises further nodes (not shown). Network 100 further comprises a radio access network comprising RNCs 135 and radio base stations 140, the radio access network being connected to the core network 100. Network 100 of FIG. 1 moreover comprises an O&M node 145 connected to the RNCs 135 and to nodes in the core network 105. In network 100, communication devices 150 may communicate with each other and with communication devices in other networks. A network 100 typically also includes a larger number of nodes other than those shown in FIG. 1.

Network 100 of FIG. 1 is given as an example only, and technologies discussed herein are not limited to networks 100 operating according to the WCDMA standard, nor to mobile radio networks, but can be applied to nodes of any communications network 100 wherein the majority of the resource requirements of different events are of linear character, as will be further discussed below.

As mentioned above, communications networks 100 are very complex structures, the accurate modeling of which is difficult. Hence, dimensioning methods based on numerical calculations wherein assumptions are made of user behavior, physical properties of the entities forming the network, etc, are complex and often do not provide sufficient accuracy.

However, telecommunications networks, as well as other communications networks 100, are basically linear systems, where the output from a network node is typically proportional to the input given to the node. For example, the processing load of a node within a communications network 100 is typically linear to the input to the node: the CPU load of a processor within an RNC 135 is linear to the control plane signaling and user plane traffic handled by the RNC processor; the CPU load of an HLR 115 is linear to the control plane signaling handled by the HLR processor, etc.

By modeling a network 100, or part of a network 100, as a linear system, wherein a load of the network 100 or part of network 100 is seen as a sum of the loads generated by a number of different key events occurring in the network 100, or part of network 100, an accurate estimate of the total load of the network 100, or part of network 100, can be obtained for a particular set of intensities of the different key events. In the following, the system for which the load is to be estimated will be referred to as the system-to-be-predicted, or system for short. A system-to-be-predicted could for example be a physical node in a communications system 100; a set of logical nodes in a network 100 or part of a network 100, such as the MSC functionality in a core network 105; an entire communications network 100; or any other system the load of which is basically linearly dependent on the input to the system. Here, the term event is used to refer to an event which may occur in the system, the occurrence of which requires an amount of the resource for which the load is to be predicted. A key event is an event which is considered in the simulation model.

Processing power, data storage capacity and band bandwidth are examples of resource types for which the load can be efficiently predicted by the simulation technology described below.

The load prediction of the present technology is based on a component modeling of the system-to-be-predicted as being linearly dependent on a number of components, where a component is defined as the load generated by a particular traffic event that may occur in the system-to-be-predicted. The load generated by a linear event at a particular point in time can be defined as:

$$L_{event} = x_{event} \times a_{event},\quad (1),$$

where $x_{event}$ denotes the required amount of a resource for performing the event once, also referred to a the event cost, while $a_{event}$ denotes the intensity of the particular event in the system-to-be-predicted. An event can for example be a data-transmission-related event, such as for example transmission of speech or data (including signaling data), in which case the event intensity $a_{event}$ can be defined as the throughput of data, where the throughput of data is a measure of the amount of transmitted data per unit time. An event may also be a control plane related event, such as for example the performance of a handover, a location update, a connection set-up, a connection release, routing of a data packet etc. In such cases, $a_{event}$ can be defined as the frequency of the occurrence of the event. In an implementation of the simulation technology wherein the total processing load is to be predicted, $x_{event}$ could denote the processing requirements of performing an event; in an implementation wherein the total data storage capacity is to be predicted, $x_{event}$ could denote the data storage requirements of an event; while in an implementation wherein the total bandwidth requirements are to be predicted, $x_{event}$ could denote the amount of bandwidth required for performing an event. In some circumstances, it might be advantageous to include an event relating to background activities performed by the system, and to set the event intensity for this background-activity-related event to a fixed value, for example $a_{event}=1$. This can for example be useful when the processing load of a system is to be predicted: For example, there will typically be some load, generated by cell-related activities, on the general purpose board processors in an RNC 135 even when there is no user activity or traffic. By introducing a background activity event of fixed intensity, the processing requirements of these background activities can be accounted for in load simulations.

The total load L of the system-to-be-predicted can be described by:

$$L = \Sigma L_{event} \quad (2),$$

where the summation is made over all the events occurring in the system-to-be-predicted.

The accuracy of the component method described by expressions (1) and (2) depends on the accuracy of the values used for the different $x_{event}$, i.e. the estimates of the required amount of the resource required for performing the event. Furthermore, the accuracy of the component method depends on the accuracy of the estimated intensity $a_{event}$ of each event. If the resource requirement $x_{event}$ of each event occurring in the system-to-be-predicted were known, as well as the intensity $a_{event}$ of each event, the total load of the system L could easily be determined by using expressions (1) and (2). A useful prediction of event intensity $a_{event}$ can typically be measured on existing networks 100, or estimated with good accuracy. However, the resource requirements $x_{event}$ of individual events are typically unknown. The resource requirements of individual events could for example be experimentally estimated in a lab environment. However, the resource requirements $x_{event}$ often differ considerably between different hardware and software releases of the equipment forming a network, and the experimental work needed for determining the resource requirements of the numerous events would typically be very large.

Alternatively, the total load of the system could be determined from simulations of the system as a linear system, where the simulation is based on measurements obtained from a reference system (which may or may not be the same system as the system-to-be-predicted). When the reference system differs from the system-to-be-predicted, the reference system could advantageously be selected to have properties similar to the system-to-be-predicted in terms of user behavior; in terms of the setting of various parameters such as timers; in terms of topological surroundings in case the system-to-be-predicted is a mobile radio network 100, etc.

Measurements obtained at m different points in time of the event intensity $a_{event}$ for a number n of key events occurring in the reference system, together with measurements of the total load L in the reference system at the m different points in time, could be used to form a simulation model wherein linear behaviour of the key events is assumed. An optimization problem, defined by use of the simulation model and a set of event intensities of the system-to-be-predicted in a scenario to be simulated, could be solved in order to obtain a prediction of the total load of the system in the scenario for which the simulation is made. In this novel simulation model, the exact resource requirement of a key event does not have to be defined, but instead, m different relationships between the resource requirements of the different key events are used in the model definition.

The key events for which the intensity is measured could for example be selected as the n events for which the product $x_{event} \times a_{event}$ is estimated to be the largest, or as the events the processing of which is estimated to account for the use of a majority of the used amount of resource-to-be-dimensioned in the reference system (for example 70%, 80% or 90% . . . ), or in any other suitable manner. The total load of the reference system L is also measured at the m different points in time.

From the m measurements of the event intensity of n different events, a set of m inequalities may be determined:

$$y_1 \le a_{11}x_1 + \ldots + a_{1j}x_j + \ldots + a_{1n}x_n \le z_1 \quad (3)$$
$$y_i \le a_{i1}x_1 + \ldots + a_{ij}x_j + \ldots + a_{in}x_n \le z_i$$
$$y_m \le a_{m1}x_1 + \ldots + a_{mj}x_j + \ldots + a_{mn}x_n \le z_m$$

where $x_j$ denotes the required amount of resource for performing the $j^{th}$ key event; $a_{ij}$ denotes the intensity of the $j^{th}$ key event at the $i^{th}$ point in time, and where the boundaries $y_i$ and $z_i$ are determined in dependence of the measured system load $L_i$ at the $i^{th}$ point in time. This could alternatively be written in matrix format:

$$Y \le A \cdot X \le Z \quad (3),$$

where A is an m*n matrix of constants, X is an n*1 column vector of variables, Y and Z are m*1 column vectors of constants.

The higher boundaries z are set so that $z_i \ge L_i$, and/or the lower boundaries y, are set so that $y_i \le L_i$. By using inequalities rather than equalities in the set of expressions (3), any events which have not been selected as part of the set of n events; as well as any non-linear behavior of the resource requirement x of an event included in the set of key events, may be accounted for. Examples of events which may display a non-linear behavior are searches, which may generate a non-linear processing load.

The set of inequalities (3) may be used in predicting the total load L generated by the set of key events, in any scenario defined by a set of intensities of the key events. In order to distinguish this scenario from the points in time for which reference measurements of the intensities were taken, an event intensity in this scenario will be denoted $b_{pj}$, and the n intensities for the n different key events in the scenario for which the total load is predicted will be denoted: $\{b_{pj}, j=1 \ldots n\}$. The total load can for example be predicted by way of linear programming, as is further discussed below.

A prediction of the load of a system can be used in many ways. In the following, the load prediction will be discussed in terms of the prediction of a processing load of a system-to-be predicted. The processing load is given as an example, for purposes of illustration, of a type of load that can be predicted by the present technology. However, the described technology is equally applicable to the load prediction of other resources, the load of which can efficiently be described by a linear behavior.

The prediction of the processing load may be used in the dimensioning of a new system, for example a new communications node or network 100. In this case, the system for which intensities $a_{ij}$ and the total loads $L_i$ have been measured is a reference system, different to the system-to-be-predicted, while the intensities $\{b_{pj}, j=1 \ldots n\}$ in the scenario for which the prediction is to be performed are estimated for the new system, i.e. the system-to-be-predicted. The predicted total processing power $L_p$ thus obtained for this scenario can then be used in determining of how many physical nodes will be required to perform the tasks of the system-to-be-predicted, and/or which processing power is required of each physical node.

The scenario for which the processing load is to be predicted, defined by the estimated intensities $\{b_{pj}, j=1 \ldots n\}$, could in this application of the processing load prediction for example be chosen so as to reflect a scenario of a high load scenario, for example a peak load scenario. Many systems are designed so that the actual processing power of the system exceeds the expected peak load processing load by a certain margin, such as for example 20% or 30%. The processing power of the physical nodes which are to cater for the predicted peak load can advantageously be selected accordingly.

Furthermore, a prediction $L_p$ of the total processing power in a particular scenario could be used in the re-dimensioning, e.g. an expansion, of an already existing system. In this application of the load prediction, the measurements of the values of intensities $a_{ij}$ and of the total loads $L_i$ could advantageously have been performed on the system-to-be-predicted, so that the reference system and the system-to-be-predicted are the same. The intensities $\{b_{pj}, j=1 \ldots n\}$, reflecting the scenario for which a load prediction is performed, could advantageously reflect a future peak load scenario, or another scenario for which information about the load is desired.

Figure 2:
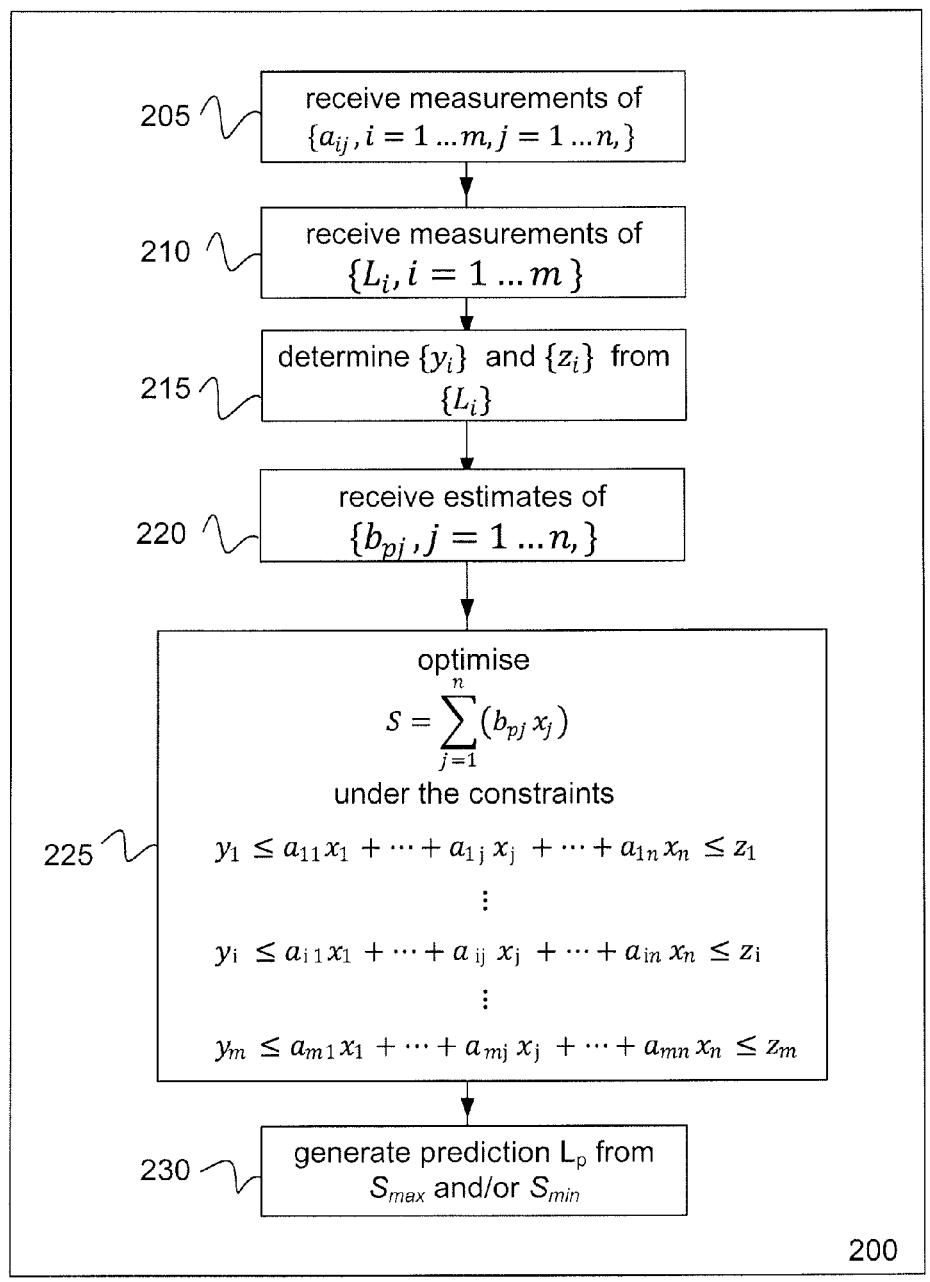
FIG. 2 is a flowchart illustrating an embodiment of a method for predicting the load of a system in a particular scenario.

Moreover, a prediction of the total processing power could be used in order to indicate to an operator of a communications network 100 that a system, such as a node or other part of network 100, is under-dimensioned, or experiences a risk of becoming under-dimensioned. In this application of load prediction, the measured values of intensities $a_{ij}$ and the total loads $L_i$ could advantageously have been performed on the system-to-be-predicted. Furthermore, the intensities $\{b_{pj}, j=1 \ldots n\}$ reflecting the scenario for which a load prediction is to be performed could advantageously reflect current measurement of the intensities of the system-to-be-predicted. If the resulting predicted total load $L_p$ exceeds a predetermined load, or if a trend in predicted loads obtained at different points in time points to a load-increasing rate higher than acceptable, an indication signal could be generated to indicate a risk that the load of the system-to-be-predicted is about to exceed tolerable levels An embodiment of a load prediction method is illustrated in the flowchart of FIG. 2. In the method of FIG. 2, an object function S is optimized under the constraints illustrated by the set of expressions (3), where the object function can be expressed as:

$$S = \sum_{j=1}^{n}(b_{pj} x_j) \quad (4),$$

or, in vector format, as $$S = B_p \cdot X. \quad (4).$$

A load prediction step 200 of FIG. 2 is shown to comprise steps 205-230. In step 205, a set of measurements $\{a_{ij}\}$ of the intensity of the key events of a reference system (which may or may not be the same system as the system-to-be-predicted) are received. The set of intensity measurements $\{a_{ij}\}$ comprises measurements performed in relation to n different key events, at m different points in time. In step 210, a set of measurements of the total processing load $\{L_i\}$ of the reference system at the m different points in time is received. The intensity measurements $\{a_{ij}\}$ and the load measurements $\{L_i\}$ could for example originate from measurements performed by an O&M node 145, or from measurements performed by the reference system itself during normal operation of the reference system.

In step 215, a set of higher boundaries $\{z_i\}$ and a set of lower boundaries $\{y_i\}$ are determined from the set of total load measurements, where the boundaries may for example be determined as:

$$y_i = L_i(1-\rho) \quad (5a)$$

$$z_i = L_i(1+\delta) \quad (5b),$$

where the parameters $\rho$ and $\delta$ are greater than (or equal to) zero and less than (or equal to) one. The parameters $\rho$ and $\delta$ may, or may not, take the same value. Furthermore, different values of $\rho$ and $\delta$ may be used when simulating different scenarios, i.e. for different sets of key event intensities $\{b_{pj}\}$ of the system-to-be-predicted. For example, the smallest values of $\rho$ and/or $\delta$ that would yield a solution to the optimization of expression (4) under the constraints defined by expressions (3) could be selected as the values of $\rho$ and $\delta$ to be used in a particular simulation scenario. Moreover, different values of $\rho$ and $\delta$ could be used for different points in time of a model, so that for example $\delta_i \neq S_k$ and so forth.

Other expressions could alternatively be used to obtain the values of the boundaries $\{y_i\}$ and $\{z_i\}$. When expressions (5a) and (5b) are used, suitable values of $\rho$ and $\delta$ could for example lie within the range 5-10%, depending on how well the n key events reflect all the events being processed by the reference system, and how well the linear model of the events processed by the reference system fits the actual processing requirements of the events. In some circumstances, it might be necessary to assume a higher value of $\rho$ and/or $\delta$ than 10% in order to find an optimal value of the object function S, and in other scenarios, values smaller than 5% may be feasible. For reasons of simplicity, it is often advantageous to set $\rho = \delta$. However, in a typical prediction scenario, $\rho$ can be set to a smaller value than $\delta$, since the discrepancy between the measured total load and the load generated by the key events is often largely caused by the fact that not all occurring events have been selected as key events.

In step 220, estimates are received of the key event intensities $\{b_{pj}\}$ of the system-to-be-predicted in the scenario p for which the total load is to be predicted. Depending on the application of the load prediction method, the event intensities could for example be estimates of a high load scenario of a system to be designed, of a future high load scenario of an existing system, or measurements and/or extrapolations of the current intensities of the key events of an existing system.

In step 225 of FIG. 2, the object function S of expression (4) is optimized under the constraints given by expressions (3) and (5a-b). This could for example be performed by linear programming. Linear programming is a well-known technique for optimization of a linear objective function subject to linear equality and inequality constraints. Several different algorithms have been developed for solving linear programming problems, such as the simplex method, the interior point method, etc., and any of these algorithms could be used in the present technology. A description of linear programming can for example be found in "*Algorithms and Theory of Computation Handbook*", edited by M. J. Atallah, *CRC Press* 1999, Chapter 31: "*Linear Programming*" by V. Chandru and M. R. Rao, hereby incorporated by reference. The optimization of the object function S given by (4) under the constraints of expressions (3) and (5a-b) could alternatively be performed by use of other another optimization method than linear programming.

In the set of expressions (3), the number of points in time m for which intensity measurements have been performed could advantageously be equal to, or close to, the number of key events n included in each expression in order to achieve an adequate prediction in the following (optimization) step. If considerably fewer measurement points are used than n, the accuracy of the load prediction will be low, and if a considerably higher number than n are used, then unnecessarily high values of the parameters $\rho$ and $\delta$ might have to be used, which could also deteriorate the prediction accuracy.

In the optimization step 225, the object function S could be either minimized and/or maximized so that a minimum value $S_{min}$ and/or a maximum value $S_{max}$ of the object function are obtained.

In step 230 of FIG. 2, a prediction of the total load $L_p$ of the system-to-be-predicted in scenario p is determined from the optimal value(s) $S_{min}$ and/or $S_{max}$ obtained in step 225. Comparisons between the predicted processing load $L_p$ of a system with measurements of the actual total processing load of the system have shown that it is often advantageous to use both the maximum and minimum values of the object function S when determining the prediction of the total load $L_p$. For example, a predicted total load $L_p$ can be obtained from the following expression:

$$L_p = \frac{S_{max} + S_{min}}{2} \quad (6)$$

Other expressions may be used for determining the predicted total load $L_p$, such as for example $L_p = S_{max}$, or $L_p = S_{min}$.

The order in which steps 205-220 are performed is not limited to that shown in FIG. 2—however, step 215 is best performed after step 210.

The method of FIG. 2 could alternatively include a further step, wherein the n key events are selected from a larger set of events occurring in the reference system in a manner discussed above. The number n of key events to be selected in such a step could for example be predetermined, or the number n of key events to be selected could be determined on a case by case basis, for example in a manner so that a certain percentage of the total load L is generated by the key events at each of the m points in time for which measurements have been provided.

Furthermore, the method of FIG. 2 could include a step, wherein m points in time at which measurements of key event intensities and total processing load are performed, are selected from a larger set of points in time. The selection could for example be performed so that the measurements of the total processing loads $L_i$ at the m different points in time are distributed over a large range of values, or in any other suitable way. The number m could for example be predetermined, or could be determined on a case by case basis. The numbers m and n should preferably be selected so that the relation m≈n holds.

Figure 3A:
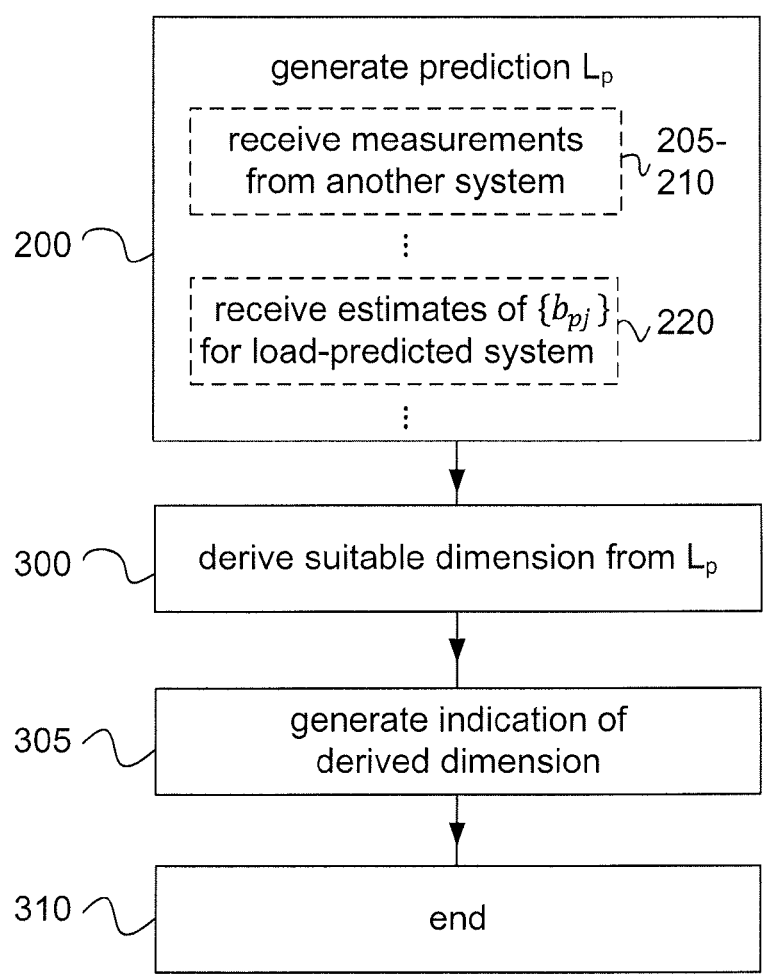
FIG. 3a is a flowchart illustrating an embodiment of a dimensioning method wherein the load prediction method of FIG. 2 is used.
Figure 3C:
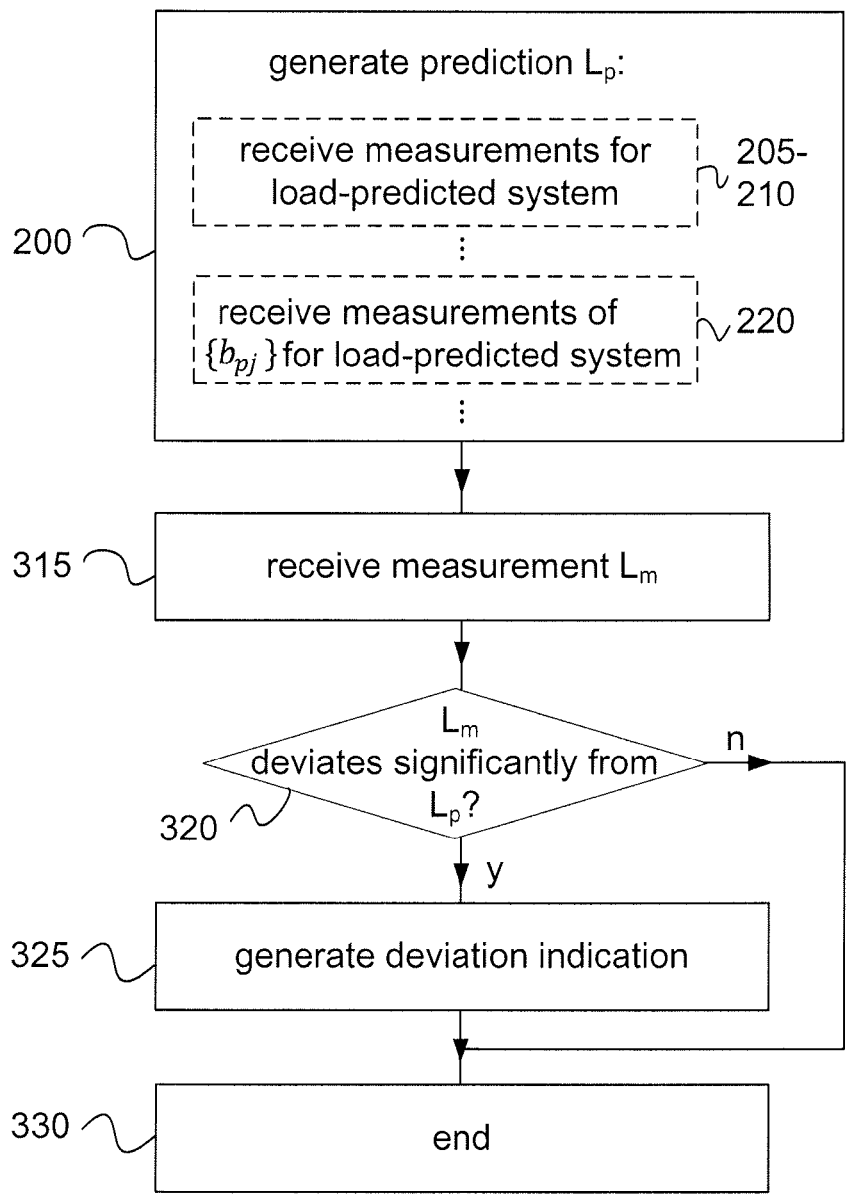
FIG. 3c is a flowchart illustrating an embodiment of a load monitoring method wherein the load prediction method of FIG. 2 is used.

FIGS. 3a-3c are flowcharts schematically illustrating three different applications of the load prediction method shown in FIG. 2. FIG. 3a illustrates an application wherein dimensioning of a new network 100 is performed by means of the method shown in FIG. 2. The system-to-be-predicted is formed of the network 100, or parts of the network 100. In step 200, a total-processing-load-prediction $L_p$ of the system-to-be-predicted is generated. As seen in FIG. 2, step 200 comprises steps 205-230. In the application shown in FIG. 3a, steps 205 and 210 are performed so that the received measurements of $\{a_{ij}\}$ and $\{L_i\}$ have been performed in another system than the system-to-be-predicted, this reference system preferably having similar properties to those of the system-to-be-dimensioned. In step 215, the boundaries $\{y_i\}$ and $\{z_i\}$ are hence determined from total-load measurements on this other reference system. In step 220, the received values of $\{b_p\}$ are however estimates of intensities of the key events at the prediction scenario in the system-to-be-predicted. Such estimates could for example reflect a peak load scenario.

In step 300, the predicted load $L_p$ obtained in step 200 is used to derive a value of a suitable dimension for the system-to-be-predicted. For example, the total number $N_{node}$ of physical nodes forming the system-to-be-predicted, and/or the size of the physical node(s), could be derived. The size of a physical node could for example be defined as a number of modules, $N_{module}$, required to form a physical node, if the physical node can be built from different modules. If the maximum acceptable load $L_{single}^{max}$ of a single physical node or module is known, then a suitable value of the number of nodes/modules to fin in the system-to-be-predicted can for example be obtained from:

$$N = \text{round up}\left(\frac{L_p}{L_{single}^{max}}\right) \quad (7)$$

When determining a suitable dimension of the system-to-be-predicted, any desired size margin should advantageously be accounted for.

In step 305 of FIG. 3a, an indication of the derived dimension is generated. Such indication could for example be a signal transmitted to a further system, an output on a user interface, etc. At step 310, the method of FIG. 3a is ended.

FIG. 3b is a flowchart illustrating an application of the load prediction method of FIG. 2 wherein a suitable dimension for an already existing network 100 is determined, in terms of a dimension of one or more nodes of the existing network 100 forming the system-to-be-predicted. In this application, measurement received in steps 205 and 210 of step 200 could advantageously have been obtained from the system-to-be-predicted, as shown in FIG. 3b. In step 220 of step 200, the received values of $\{b_{pj}\}$ are, similarly, estimates of intensities of the key events at the prediction scenario in the system-to-be-predicted of the network 100 to be expanded (or made smaller). Such estimates could for example reflect an expected peak load scenario. Steps 300-310 of FIG. 3b correspond to steps 300-310 of FIG. 3a.

FIG. 3c is a flowchart illustrating an application of the load prediction method of FIG. 2 wherein it is checked whether the total load of a system at a particular time corresponds to the expected total load of the system at the time. In this application, the system for which the load-correspondence check is made is the system-to-be-predicted. Furthermore, the system-to-be-predicted and the reference system are the same. Hence, the measurements received in steps 205 and 210 of step 200 are measurements of $\{a_{ij}\}$ and $\{L_i\}$ obtained from the system-to-be-predicted. In step 220 of step 200, the estimates of $\{b_{pj}\}$ are measurements of the intensities of the key events in the system-to-be-predicted at a time $t_c$. Hence, the predicted total load $L_p$ obtained in step 200 will be a measure of the expected total load at the time $t_c$. In step 315, a measurement $L_m$ of the total load at time $t_c$ is received. In step 320, it is checked whether $L_m(t_c)$ deviates significantly from $L_p(t_c)$. If the load prediction model is good, i.e. if the n key events and the m points in time used for creating the model have been carefully selected, such a deviation will be an indication that the system is not working properly. For example, if a lot of communication attempts are rejected by the system due to lack of resources, the measured processing load will typically be larger than the predicted processing load, since the system will spend processing power on searching for resources and handling of rejected communication attempts—hence, the system no longer operates in the normal fashion on which the model was based.

The check in step 320 could for example include a check as to whether the ratio of $L_m(t_c)$ to $L_p(t_c)$ exceeds a threshold, the threshold typically being larger than 1 (for example 1.5). If a significant deviation is detected in step 320, step 325 is entered, wherein a deviation indication is generated. A deviation indication could for example be a signal transmitted to a user interface, or a signal transmitted to an O&M node 145 for further analysis. If desired, the deviation indication could include information relating to the magnitude of the deviation. In step 330, the process is ended. If no significant deviation is detected in step 320, step 330 is entered without first entering step 325.

The time $t_c$ at which the total processing load is both predicted and measured could for example be a current point in time. The load prediction could then be performed from time to time, for example on a regular basis, in order to provide an early indication of any performance degradation. The time $t_c$ could also be a historic point in time. For example, if a performance problem in a system is detected, an analysis of historic points in time $t_c$ according to the method of FIG. 3c could reveal at which point in time the performance degradation started, thus facilitating the trouble-shooting process. In this latter application of the method of FIG. 3c, step 320 could be omitted, if desired, and a deviation indication indicative of the magnitude of the deviation could be generated in step 325, regardless of deviation magnitude.

Figure 4:
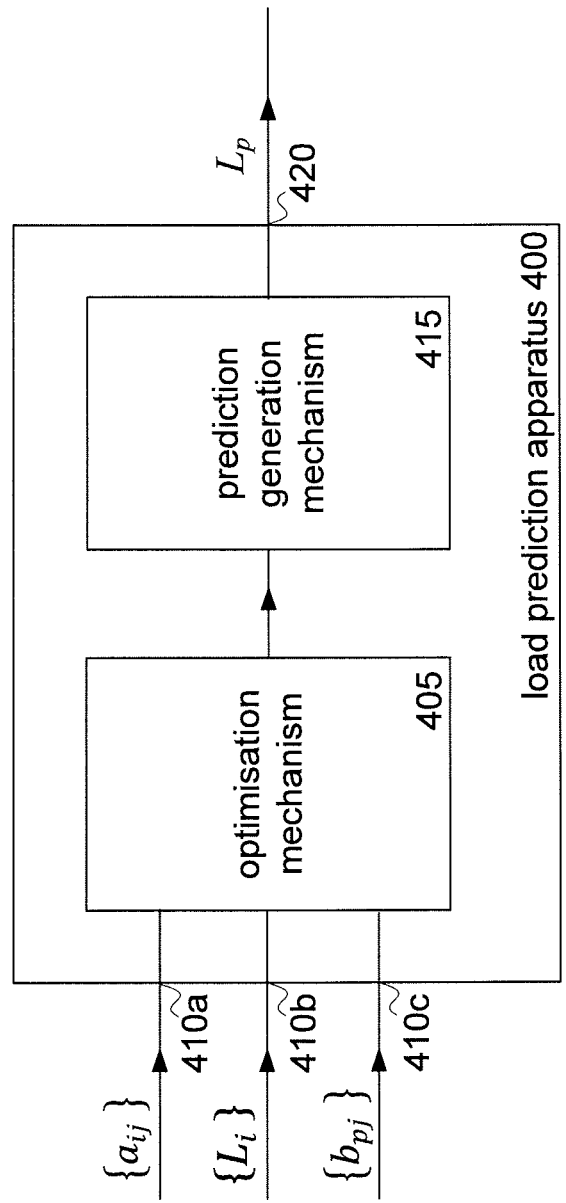
FIG. 4 is a schematic illustration of an embodiment of a load prediction apparatus.

FIG. 4 is a schematic illustration of simulation apparatus 400 in the form of a load prediction apparatus arranged to predict the total load of a system-to-be-predicted. Load prediction apparatus 400 comprises an optimization mechanism 405, arranged to optimize an object function S, such as the object function defined in expression (3), under a given set of constraints, for example inequality constraints of the form given in expression (3). Load prediction apparatus 400 further comprises an input 410a configured to receive a signal indicative of a set of measurements $\{a_{ij}\}$ of intensities of different events of the reference system, an input 410b configured to receive a signal indicative of a set of measurements of the total load $\{L_i\}$ of the reference system, and an input 410c configured to receive a signal indicative of a set of estimates $\{b_{pj}\}$ of the intensities of a number of different events in the system-to-be-predicted in a scenario for which the total load is to be predicted. Inputs 410a, b and c may be the same, or different, physical inputs.

Optimization mechanism 405 of FIG. 4 is responsively connected to inputs 410a, 410b and 410, and the optimization mechanism 405 is configured to extract, from signals received at these inputs, values of $\{a_{ij}\}$, $\{L_i\}$, and $\{b_{pj}\}$ to be used in the optimization of the object function S (cf. FIG. 2). Optimization mechanism 405 of FIG. 4 is further programmably configured to perform steps 210 and 225 of step 200, and to generate a maximum value of the object function $S_{max}$, and/or a minimum value of the object function, $S_{min}$, and to output a signal indicative of the(se) value(s). An optimization mechanism 405 could for example be configured to perform optimization of S by means of linear programming, or by means of any other suitable optimization procedure.

Load prediction apparatus 400 of FIG. 4 is shown to further comprise a prediction generation mechanism 415, responsively connected to the output of optimization mechanism 405, and arranged to receive an output signal from optimization mechanism 405. Prediction generation mechanism 415 is also connected to an output 420 of load prediction apparatus 400. Prediction generation mechanism 415 of FIG. 4 is programmably to generate a prediction $L_p$ of the total load of the system-to-be-predicted based on the value(s) of $S_{min}$ and/or $S_{max}$, for example using expression (6). Prediction generation mechanism 415 is further configured to deliver a signal indicative of this predicted value to output 420. If the load prediction apparatus 400 is configured to equal the prediction $L_p$ to $S_{min}$ or $S_{max}$, then prediction generation mechanism 415 could be seen as part of the optimization mechanism 405, the output of which could be directly connected to the output 420 of load prediction apparatus 400.

Figure 5:
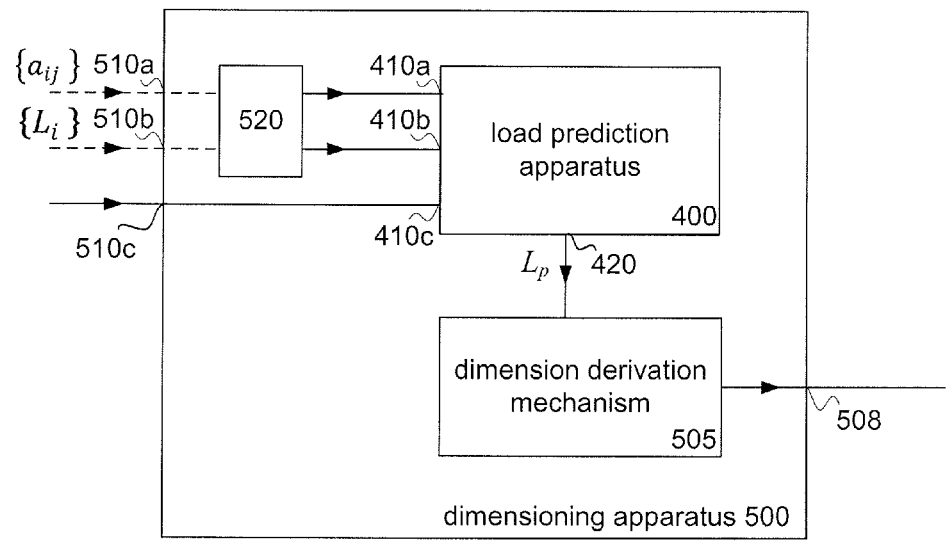
FIG. 5 is a schematic illustration of an embodiment of a dimensioning apparatus comprising the load prediction apparatus of FIG. 4.

FIG. 5 is a schematic illustration of an example of a dimensioning apparatus 500 configured to provide a signal indicative of a suitable dimension for a system-to-be-predicted in a certain scenario defined by a set of event intensities $\{b_{pj}\}$. Dimensioning apparatus 500 comprises a load prediction apparatus 400 and a dimension derivation mechanism 505. Dimension derivation mechanism 505 of FIG. 5 is responsively connected to the output 420 of load prediction apparatus 400, and configured to receive a prediction $L_p$ of the total load of a system-to-be-predicted from output 420 of load prediction apparatus 400. Dimension derivation mechanism 505 of FIG. 5 is further programmably configured to derive a suitable dimension for system-to-be-predicted (cf. step 300 of FIGS. 3a and 3b), for example by use of expression (7). Dimension derivation mechanism 505 could further comprise a computer storage/memory (not shown) for storing information relating to a maximum load of a node or module of the system-to-be-predicted (cf. $L_{single}^{max}$ of expression (7)). Dimension deriving mechanism 505 is configured to generate a signal indicative of a derived suitable dimension, and provide this signal at the output 508 of dimensioning apparatus 500. Output 508 could for example be connected to a user interface, or to an analysis apparatus.

At an input 510c, dimensioning apparatus 500 is arranged to receive a signal indicative of a set of event intensities $\{b_{pj}\}$, representing a scenario for which the system-to-be-predicted is to be dimensioned (typically a peak load scenario). Input 510c could for example be connected to receive data from a user interface, or from another system. Data representing the system model, i.e. a set of measured event intensities $\{a_{ij}\}$ and a corresponding set of total loads $\{L_i\}$ obtained at the same points in time, could be received via inputs 510a and 510b, respectively. The dimensioning apparatus 500 of FIG. 5 is further shown to comprise a memory 520 for storing such data representing the system model, memory 520 being connected to inputs 510a and 510b for receiving such data, and to inputs 410a and 410b of load prediction apparatus for delivering such data to load prediction apparatus 400. In one implementation, data stored in memory 520 could be updated from time to time via inputs 510a/510b in order to reflect the current circumstances under which the system-to-be-predicted operates. In another implementation, the data stored in memory 520 could be static, in which case inputs 510a and 510b could be omitted.

Dimensioning apparatus 500 of FIG. 5 is programmably configured to perform any one of the methods shown in FIGS. 3a and 3b, depending on which data is stored in memory 520 or received via inputs 510a and 510b (cf. step 200 of FIGS. 3a and 3b, respectively).

Figure 6A:
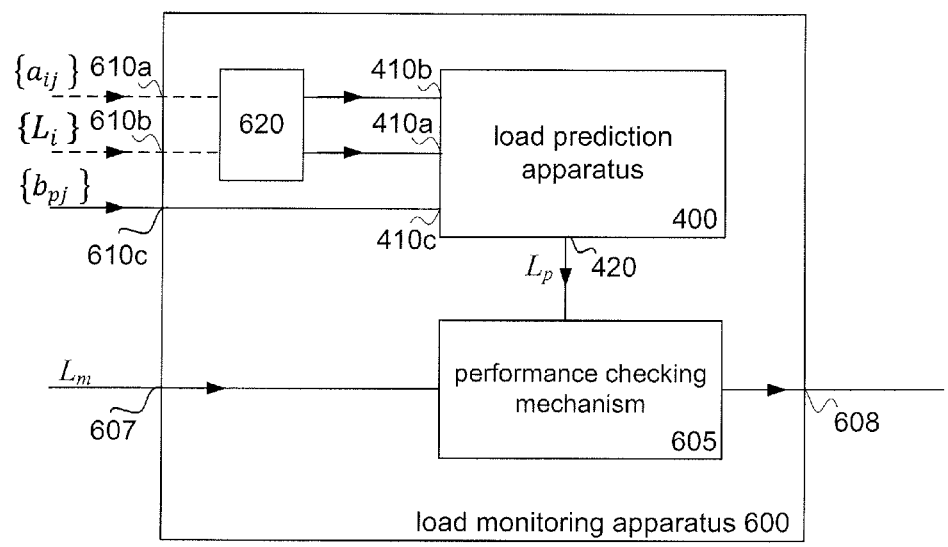
FIG. 6a is a schematic illustration of an embodiment of a load monitoring apparatus comprising the load prediction apparatus of FIG. 4

In FIG. 6a, a schematic illustration of an example of a load monitoring apparatus 600 is shown. Load monitoring apparatus 600 of FIG. 6a comprises a load prediction apparatus 400 having an output 420 to which a performance checking mechanism 605 is connected. Performance checking mechanism 605 is further connected to an input 607, which is configured to receive a measured value $L_m$ of the total processing load of the system-to-be-predicted. Performance checking mechanism 605 of FIG. 6 could be programmably configured to check whether a value of $L_m$ received at input 607 deviates significantly from a predicted load $L_p$ received from load prediction apparatus 420, for example by checking whether the ratio of $L_m$ to $L_p$ exceeds a threshold (cf. step 320 of FIG. 3c). Performance checking mechanism 605 could include a memory (not shown) for storing a threshold. Performance checking mechanism 600 of FIG. 6a could furthermore be configured to generate a deviation indication at output 608 of load monitoring apparatus if performance checking mechanism 600 has detected a significant deviation of $L_m$ from $L_p$. Output 608 could for example be connected to a user interface, or to a further system for analysis.

Load monitoring apparatus 600 of FIG. 6a further comprises inputs 610a-c and memory 620. Inputs 610a-b and memory 620 correspond to inputs 510a-b and 520 described in relation to FIG. 5, and will not be further described. However, input 610c of load monitoring apparatus 600 is used to receive measurements of key event intensities $\{b_{pj}\}$ of the system-to-be-predicted, where a set of key event intensities correspond to an $L_m$ measurement performed at the same time and received at input 607. In order to ensure that a measurement $L_m$ obtained at a particular time $t_c$ is compared by a prediction $L_p$ generated in relation to intensity measurements $\{b_{pj}\}$ obtained at the same time $t_c$, a coordination mechanism, for example a trigger mechanism triggering the provision of measurements of $\{b_{pj}\}$ and $L_m$ at the inputs 610c and 607, respectively, could be provided—either in load monitoring apparatus 600, or at an external device providing performing monitoring apparatus 600 with such measurements. Alternatively, inputs 607 and 610c could be the same input, wherein a set of the key event intensities $\{b_{pj}\}$ and a corresponding total load measurement $L_m$ could be received together.

In an implementation of load monitoring apparatus 600 wherein historic measurements of $\{b_{pj}\}$ and $L_m$ are analyzed, performance checking mechanism 605 would not have to (but could) perform a check as to whether a significant deviation exists between $L_m$ and $L_p$. However, if a set of $L_m$ measurements obtained at a set of different historical points in time are received, as well as sets of intensity measurements $\{b_{pj}\}$ obtained at corresponding points in time, performance checking mechanism 605 could for example include a buffer for storing the set of $L_m$ measurements, as well as a buffer for storing the corresponding set of predictions $L_p$ generated by load prediction apparatus 400, and a mechanism for ensuring that an $L_m$ value is associated with the correct $L_p$ value, obtained from measurements performed at the same point in time. The buffers could for example be FIFO buffers. Alternatively, inputs 607 and 610c could be the same, as described above. In the implementation wherein historic measurements are analyzed, the signal provided at output 608 could be indicative of a set of corresponding $(L_m, L_p)$ pairs, which could be further analyzed at for example a user interface. Alternatively, performance checking mechanism 605 could be configured to perform an analysis of the $(L_m, L_p)$ pairs, such as for example an analysis of the size of the deviation of $L_m$ from $L_p$ as a function of time, in which case the output from load monitoring mechanism 605 could be signal indicating a point in time at which the deviation exceeds a threshold value.

Figure 6B:
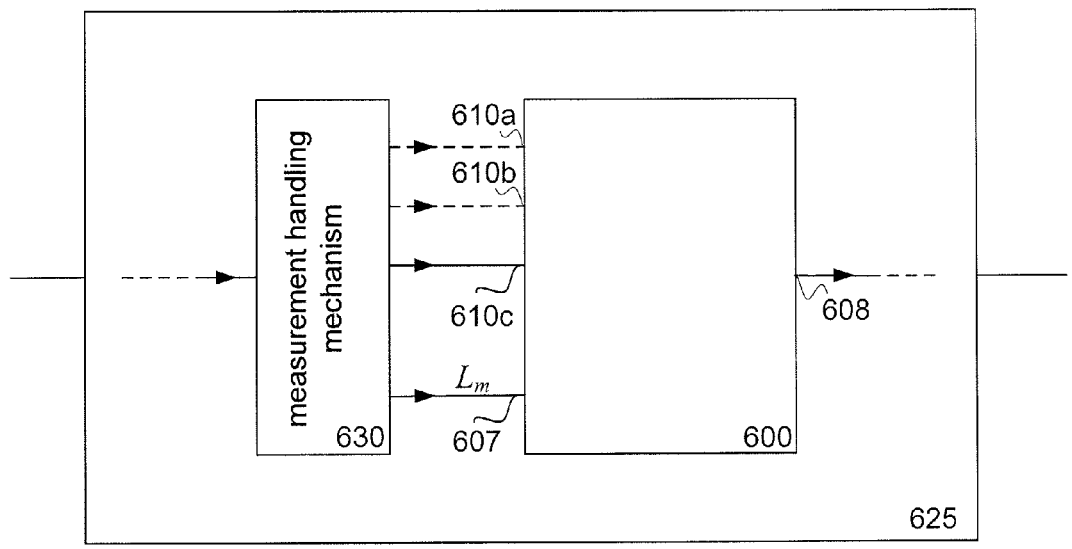

In FIG. 6b, an implementation of a load monitoring apparatus 600 in a communications node 625 of a network 100 is illustrated. Communications node 625 could for example be a node wherein user data traffic is handled, such as for example the RNC 135, MSC 110, HLR 115, SGSN 120 or GGSN 125 of FIG. 1, a router, a switch etc, or an O&M node 145 monitoring the operation of a node wherein user data traffic is handled. Communications node 625 of FIG. 6b is shown to include, in addition to a load monitoring apparatus 600, a measurement handling mechanism 630 connected at least to inputs 607 and 610c of the load monitoring apparatus. If communications node 625 is the system-to-be-predicted which is to be monitored by load monitoring apparatus 600, measurement handling mechanism 630 could advantageously perform measurements of the current key event intensities $\{b_{pj}\}$ and the current load $L_m$ and provide the load monitoring apparatus of a signal indicative of the results of such measurements. If the communications node 625 is an O&M node and the system-to-be-predicted is a different node, the measurement handling mechanism 630 could be configured to receive signals from the system-to-be-predicted from which measurement results could be extracted, and to provide the load monitoring apparatus 600 with such results (if the load of an O&M node 145 is to be monitored, the O&M node 145 could be the system-to-be-predicted). A communications node 625 typically comprises further parts, not shown in FIG. 6b.

Figure 7:
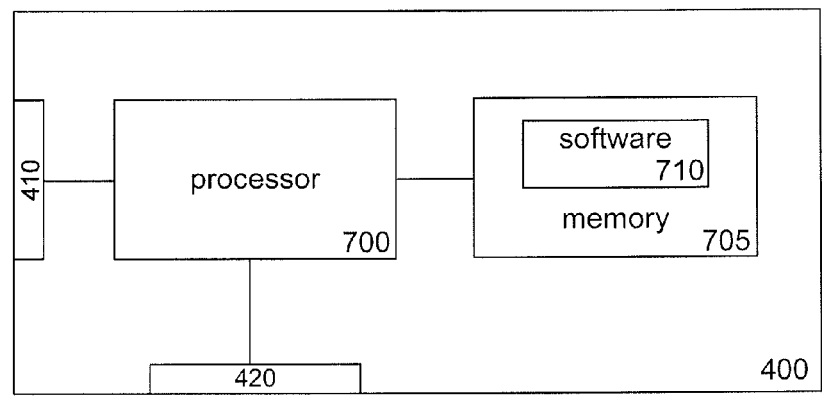
FIG. 7 is an alternative representation of the load prediction apparatus of FIG. 4.

In FIG. 7, an alternative way of schematically illustrating the load prediction apparatus 400 of FIG. 4 is shown. FIG. 7 shows the load prediction apparatus 400 comprising a processor 700 connected to a computer program product 705 in the form of a memory. Processor 700 of FIG. 7 is furthermore responsively connected to interfaces 410 (representing interfaces 410a-c), and connected to interface 420. The memory comprises computer readable means that stores computer program(s) 710 which, when executed by the processor 700, causes the load prediction apparatus 400 to perform the method illustrated in FIG. 2. In other words, the load prediction apparatus 400 and its mechanisms 405 and 415 may in this embodiment be implemented with the help of corresponding program modules of the computer program 710.

The illustration of FIG. 7 could alternatively represent an alternative way of illustrating the dimensioning apparatus 500 or the load monitoring apparatus 600, wherein the memory 705 stores computer programs(s) 710 which, when executed by processor 700, causes the dimensioning apparatus 500 or the load monitoring apparatus 600 to perform the method illustrated by FIG. 3a or 3b in the dimensioning apparatus case, or the method of FIG. 3c in the load monitoring apparatus case.

Processor 700 could be one or more physical processors— for example, one processor of processor 700 could be arranged to execute code relating to the optimisation mechanism 405, and another processor could be arranged to execute code relating to the interfaces 410 and 420 etc, or the same processor could be used for the different mechanisms. The memory 705 could be any type of non-volatile computer readable means, such as a hard drive, a flash memory, a CD, a DVD, an EEPROM etc. Memory 705 could be the same physical memory as memory 520 or 620 in case of the dimensioning apparatus or the load monitoring apparatus, respectively, or a different physical memory.

The load prediction apparatus 400, the dimensioning apparatus 500, and the load monitoring apparatus 600 could alternatively be implemented as hardware only.

The above described load prediction technology has been shown to provide accurate predictions of the load of communications systems in wide-varying scenarios. Load predictions of the processing load of a live system-to-be-predicted will be illustrated in FIGS. 8 and 9.

In FIG. 8, a table including a set of intensities $\{a_{ij}\}$ and total processing loads measured on a system-to-be-predicted is shown. The table of FIG. 8 includes intensity measurements of 14 different key events (n=14) at 15 different points in time (m=15), as well as a set of measured total processing loads $L_i$ obtained at the 15 different points in time. Based on these measurements, a model for the behavior of the processing load of the system-to-be-predicted can be derived as described above. The system-to-be-predicted of FIG. 8 is a special purpose board of an RNC 135, and examples of the key events used to model the processing behavior of the special purpose board are RNC 135 are: Speech Access, CS Data Access, PS Access, HS Access, Cell Update, Location Update & SMS, Soft Handover, voice data transmission, CS data transmission, etc.

Figure 9:
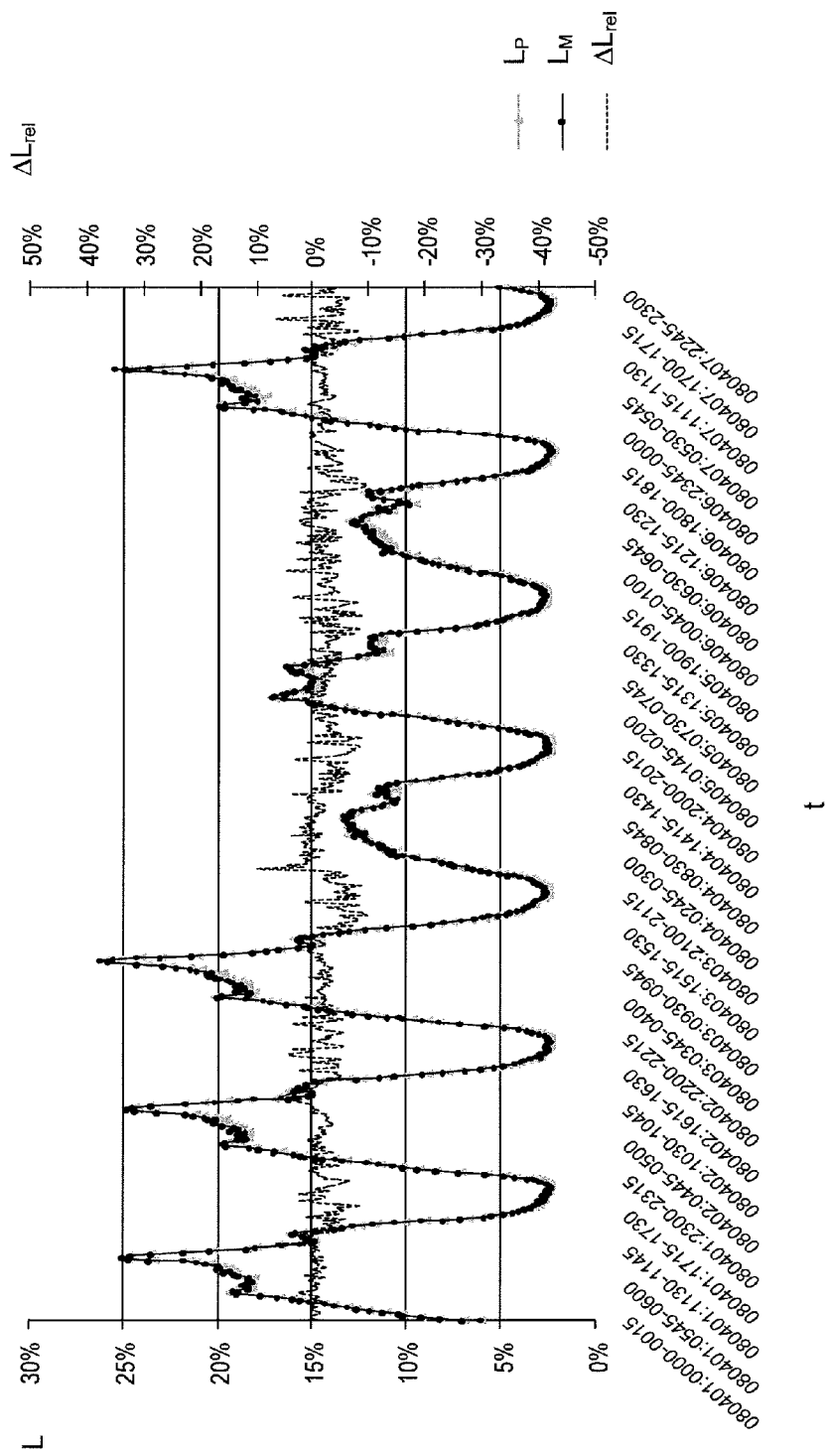
FIG. 9 is a graph illustrating measurements of the total processing load, as well as predictions of the total processing load, as a function of time for a special purpose processing board of an RNC.

FIG. 9 is a graph showing results of simulations of the load experienced by the special purpose board for which the data of FIG. 8 have been collected. The data of FIG. 8 were used in the simulation model used to obtain the load predictions shown in FIG. 9. Load predictions $L_p$ were made, and measurements $L_m$ of the total load were taken, for different points in time during a period of 7 days. In the graph of FIG. 9, the predictions of the load $L_p$ obtained in the simulations are compared with the measured load $L_m$ as a function of time. The values of FIG. 9 were obtained by use of the method illustrated in step 200 of FIG. 3c, i.e. measurements of the actual intensities of the key events were used to form the intensities $\{b_{pj}\}$ representing the scenario for which the load were to be predicted. As can be seen in the graph, the predicted load and the measured load follow each other closely, and thus, the accuracy of the load prediction is very good. A curve representing the relative difference between the predicted load and the measured load has also been included in the graph, this curve being referred to as "Load Diff" in the graph. In the simulations shown in FIG. 9, the boundaries for the inequalities of expression (3) were defined using expressions (5a) and (5b), where the parameters ρ and δ were both set to 2%. Similar comparisons between load predictions obtained by the present technology and measurements of actual load have been performed for a number of different types of processors, showing excellent results.

A great advantage of the above described load prediction method is its accuracy in combination with its simplicity. Furthermore, the behaviour of a user of the communication system, or of the network 100 of which the communications system forms a part, is not inherent to the model by which load predictions are generated. Instead, the user behaviour is provided to the model as an input in the form of an estimation of the intensities $\{b_{pj}\}$ of a number of key events. Impacts of different user behaviours to the system are secured by the system model created during simulation. Hence, load predictions relating to many different user behaviour scenarios can easily be obtained.

Moreover, no assumptions of the physical properties of the system-to-be-predicted have to be made in designing of the system model, other than the assumption that the system-to-be-predicted is similar to the reference system. Rather, the assumed properties of the system-to-be-predicted are reflected in the measurements of the the intensity measurements $\{a_{ij}\}$ and the load measurements $\{L_i\}$ on the reference system on which the simulation model is based. Hence, the simulation method works equally well on different versions or releases of hardware and/or software of a system-to-be-predicted, without requiring that new values are determined of system properties that vary between the versions or releases, thus saving a lot of time and effort as compared to previous load prediction techniques. The technology works equally well on any combination of hardware and software. In order to obtain high accuracy values of the load prediction, the intensity measurements $\{a_{ij}\}$ and the load measurements $\{L_i\}$ of the simulation model could advantageously be updated between new releases of hardware and/or software of the system-to-be-predicted.

In the above, the load prediction methods and apparatuses have been described in terms of the processing load of a system, the system for example being a communications node 625; part of a network 100; a communications node type in a network 100; or a network 100. However, the described technology is also applicable to other aspects of a communications network 100 which may be limiting for the performance of network 100, such as data storage capacity, or bandwidth. Hence, the load in different scenarios on for example the data storage capacity or bandwidth may be predicted by means of the method of FIG. 2. The component method of expression (1) could be used for describing data storage capacity, or bandwidth, in which case a component $x_{event}$ could for example denote the data storage capacity required by a certain event, or an amount of bandwidth required for a particular event, respectively.

The invention has been described above in terms of a WCDMA network. However, the invention is applicable to all kinds of systems of any type of communications network 100, such as:
  GSM/WCDMA/LTE Radio Access Network nodes, e.g. BTS, BSC, Node B, RNC, eNodeB etc.
  Core Network nodes, e.g. SGSN, GGSN, MGW etc.
  Network nodes in computer networks in general, e.g. gateway, router, bridge, switch etc.

Furthermore, the invention is also applicable to other processor based systems wherein the majority of the events show a linear behavior.

Although various aspects of the invention are set out in the accompanying independent claims, other aspects of the invention include the combination of any features presented in the above description and/or in the accompanying claims, and not solely the combinations explicitly set out in the accompanying claims.

One skilled in the art will appreciate that the technology presented herein is not limited to the embodiments disclosed in the accompanying drawings and the foregoing detailed description, which are presented for purposes of illustration only, but it can be implemented in a number of different ways, and it is defined by the following claims.

The invention claimed is:

1. A method of simulating a system in a communications network in order to obtain a prediction of a total load of a resource in the system, the method comprising:
  receiving, at an input of a load prediction apparatus, intensity values $\{a_{ij}, i=1 \ldots m, j=1 \ldots n\}$ for n events occurring in a reference system at m different occasions $t_i$, wherein the occurrence of an event j requires a resource amount $x_j$ of the resource in the reference system;
  receiving, at an input of the load prediction apparatus, values of a total load $L_i$ of the resource in the reference system at the m different occasions $t_i$;
  receiving, at an input of the load prediction apparatus, intensity values $\{b_{pi}, p, j=1 \ldots n\}$ for each of the n events in a scenario p in the system for which the total load of the resource is to be predicted;
  optimizing, in the load prediction apparatus, an object function S described by:

$$S = \Sigma^n_{j=1}(b_{pj} x_j),$$

subject to the linear inequality constraints described by:

$$y_1 \leq a_{11} x_1 + \ldots + a_{1j} x_j + \ldots + a_{1n} x_n \leq z_1$$
  $$y_i \leq a_{i1} x_1 + \ldots + a_{ij} x_j + \ldots + a_{in} x_n \leq z_i$$
  $$y_m \leq a_{m1} x_1 + \ldots + a_{mj} x_j + \ldots + a_{mn} x_n \leq z_m$$

wherein $y_i$ and $z_i$ are functions of the measured total load $L_i$ of the resource in the reference system, the optimization resulting in at least one optimized outcome of the object function S; and
  obtaining a prediction $L_p$ of the total load of the resource in the system based on the at least one optimized outcome of the object function S.

2. The method of claim 1, wherein $y_i = L_i(1-\rho)$ and/or $z_i = L_i(1+\delta)$, where $\rho$ and $\delta$ are parameters and $0 < \rho < 0.5$ and $0 < \delta < 0.5$.

3. The method of claim 1, wherein:
  the object function S is optimized so as to arrive at a minimum outcome $S_{min}$ and a maximum outcome $S_{max}$ of the object function S; and
  the load prediction $L_p$ is obtained as a function of the minimum outcome $S_{min}$ and the maximum outcome $S_{max}$ of the object function S.

4. The method of claim 1, wherein the system for which the total load of the resource is to be predicted is also the reference system.

5. The method of claim 4, wherein the received intensity values $\{b_{pj}\}$ for each of the n events in the scenario in the system for which the total load of the resource is to be predicted have been obtained from measurements of the intensity of the n events in the system-to-be-predicted at a particular point in time $t_c$; and wherein the method further comprises:
  generating the prediction $L_p$ of the total load of the resource in the system for which the total load of the resource is to be predicted using at least one optimized outcome of the object function S;

receiving a measurement $L_m$, obtained at the particular point in time $t_c$, of the total load of the resource to be predicted;

comparing the predicted total load $L_p$ at the time $t_c$ to the measured total load $L_m$ at the time $t_c$; and if the measured total load $L_m$ deviates from the predicted total load $L_p$ by more than a predefined measure, then generating an indication that the measured total load $L_m$ deviates from the predicted total load $L_p$.

6. The method of claim 1, further comprising:

generating the prediction $L_p$ of the total load of the resource in the system for which the load is to be predicted using at least one optimized outcome of the object function S;

deriving, from the prediction $L_p$ of the total load of the resource in the system, a value of a dimension of the simulated system; and generating a signal indicative of said value of a dimension.

7. The method of claim 1, wherein the optimization of the object function S is performed by means of linear programming.

8. The method of claim 1, wherein the resource for which the prediction of the total load of the resource is to be obtained are processing resources of the system.

9. A simulation apparatus for simulating a system in a communications network in order to obtain a prediction of a total load of a resource in the system, the simulation apparatus comprising:

an input configured to receive intensity values $\{a_{ij}, i=1 \ldots m, j=1 \ldots n\}$ for n events occurring in a reference system at m different occasions $t_i$, wherein the occurrence of an event j requires a resource amount $x_j$ of the resource in the reference system;

an input configured to receive values of a total load $L_i$ of the resource in the reference system at the m different occasions $t_i$;

an input configured to receive intensity values $\{b_{pj}, p, j=1 \ldots n\}$ for each of the n events in a scenario p in the system for which the total load of the resource is to be predicted; and at least one processor connected to said inputs and configured to:

determine a higher boundary $z_i$ and a lower boundary $y_i$ from a received value of the total load $L_i$ of the resource in the in the reference system;

optimize an object function S described by:

$S=\Sigma_{j=1}^{n}(b_{pj}x_j)$, subject to the linear inequality constraints described by:

$y_1 \leq a_{11}x_1 + \ldots + a_{1j}x_j + \ldots + a_{1n}x_n \leq z_1$ $y_i \leq a_{i1}x_1 + \ldots + a_{ij}x_j + \ldots + a_{in}x_n \leq z_i$ $y_m \leq a_{m1}x_1 + \ldots + a_{mj}x_j + \ldots + a_{mn}x_n \leq z_m$ in a manner so that the optimization results in at least one optimized outcome of the object function S, whereby a prediction $L_p$ of the total load in the system may be obtained; and deliver a signal indicative of at least one optimized outcome of the object function S.

10. The simulation apparatus of claim 9, wherein said at least one processor is configured to:

generate the prediction $L_p$ of the total load of the resource using the at least one optimized outcome of the object function S; and derive, from the prediction $L_p$ of the total load of the resource in the system, a value of a dimension of the simulated system.

11. The simulation apparatus of claim 9, wherein said at least one processor is configured to:

generate the prediction $L_p$ of the total load of the resource using the at least one optimized outcome of the object function S;

receive a measurement $L_m$ of the total load of the resource to be predicted;

compare the predicted total load $L_p$ of the resource to the measured total load $L_m$ of the resource; and generate an indication if the measured total load $L_m$ of the resource deviates by more than a predefined measure from the predicted total load $L_p$ of the resource to which it is compared.

12. The simulation apparatus of claim 11, wherein said simulation apparatus comprises part of a communications node that is configured for use in a communications network.

13. A non-transitory computer-readable medium storing a computer program for simulating a system in a communications network in order to obtain a prediction of a total load of a resource in the system, the computer program comprising computer program code portions that, when run on a simulation apparatus, cause the simulation apparatus to:

extract, from a received signal, intensity measurement values $\{a_{ij}, i=1 \ldots m, j=1 \ldots n\}$ for n events occurring in a reference system at m different occasions $t_i$, wherein the occurrence of an event j requires a resource amount $x_j$ of the resource in the reference system;

extract, from a received signal, values of a total load $L_i$ of the resource in the reference system at the m different occasions $t_i$;

extract, from a received signal, intensity values $\{b_{pj}, p, j=1 \ldots n\}$ for each of the n events in a scenario p in the system for which the total load of the resource is to be predicted;

optimize an object function S described by:

$S=\Sigma_{j=1}^{n}(b_{pj}x_j)$, subject to the linear inequality constraints described by:

$y_1 \leq a_{11}x_1 + \ldots + a_{1j}x_j + \ldots + a_{1n}x_n \leq z_1$ $y_i \leq a_{i1}x_1 + \ldots + a_{ij}x_j + \ldots + a_{in}x_n \leq z_i$ $y_m \leq a_{m1}x_1 + \ldots + a_{mj}x_j + \ldots + a_{mn}x_n \leq z_m$ wherein $y_i$ and $z_i$ are functions of the measured total load $L_i$ of the resource in the reference system, the optimization resulting in at least one optimized outcome of the object function S; and obtain a prediction $L_p$ of the total load of the resource in the system to be predicted based on the at least one optimized outcome of the object function S.

* * * * *